United States Patent
Wu et al.

(10) Patent No.: US 7,919,384 B2
(45) Date of Patent: Apr. 5, 2011

(54) METHOD OF MAKING PLANAR-TYPE BOTTOM ELECTRODE FOR SEMICONDUCTOR DEVICE

(75) Inventors: Hsiao-Che Wu, Chung-Li (TW); Ming-Yen Li, Fongshan (TW); Wen-Li Tsai, Renwu Township, Kaohsiung County (TW)

(73) Assignee: ProMOS Technologies Inc., Hsinchu (TW)

( * ) Notice: Subject to any disclaimer, the term of this patent is extended or adjusted under 35 U.S.C. 154(b) by 452 days.

(21) Appl. No.: 12/050,649

(22) Filed: Mar. 18, 2008

(65) Prior Publication Data
US 2009/0023264 A1 Jan. 22, 2009

(30) Foreign Application Priority Data

Jul. 17, 2007 (TW) .............................. 96126042 A

(51) Int. Cl.
*H01L 21/20* (2006.01)
(52) U.S. Cl. . 438/386; 438/243; 257/301; 257/E27.048; 257/E27.092
(58) Field of Classification Search .................. 438/386, 438/243; 257/E27.048, E27.092, 301
See application file for complete search history.

(56) References Cited

U.S. PATENT DOCUMENTS
6,914,286 B2 * 7/2005 Park .............................. 257/304
* cited by examiner

*Primary Examiner* — Asok K Sarkar
*Assistant Examiner* — Julia Slutsker
(74) *Attorney, Agent, or Firm* — Muncy, Geissler, Olds & Lowe, PLLC

(57) ABSTRACT

A method of making planar-type bottom electrode for semiconductor device is disclosed. A sacrificial layer structure is formed on a substrate. Multiple first trenches are defined in the sacrificial layer structure, wherein those first trenches are arranged in a first direction. The first trenches are filled with insulating material to form an insulating layer in each first trench. Multiple second trenches are defined in the sacrificial layer structure between the insulating layers, and are arranged in a second direction such that the second trenches intersect the first trenches. The second trenches are filled with bottom electrode material to form a bottom electrode layer in each second trench. The insulating layers separate respectively the bottom electrode layers apart from each other. Lastly, removing the sacrificial layer structure defines a receiving space by two adjacent insulating layers and two adjacent bottom electrode layers.

19 Claims, 15 Drawing Sheets

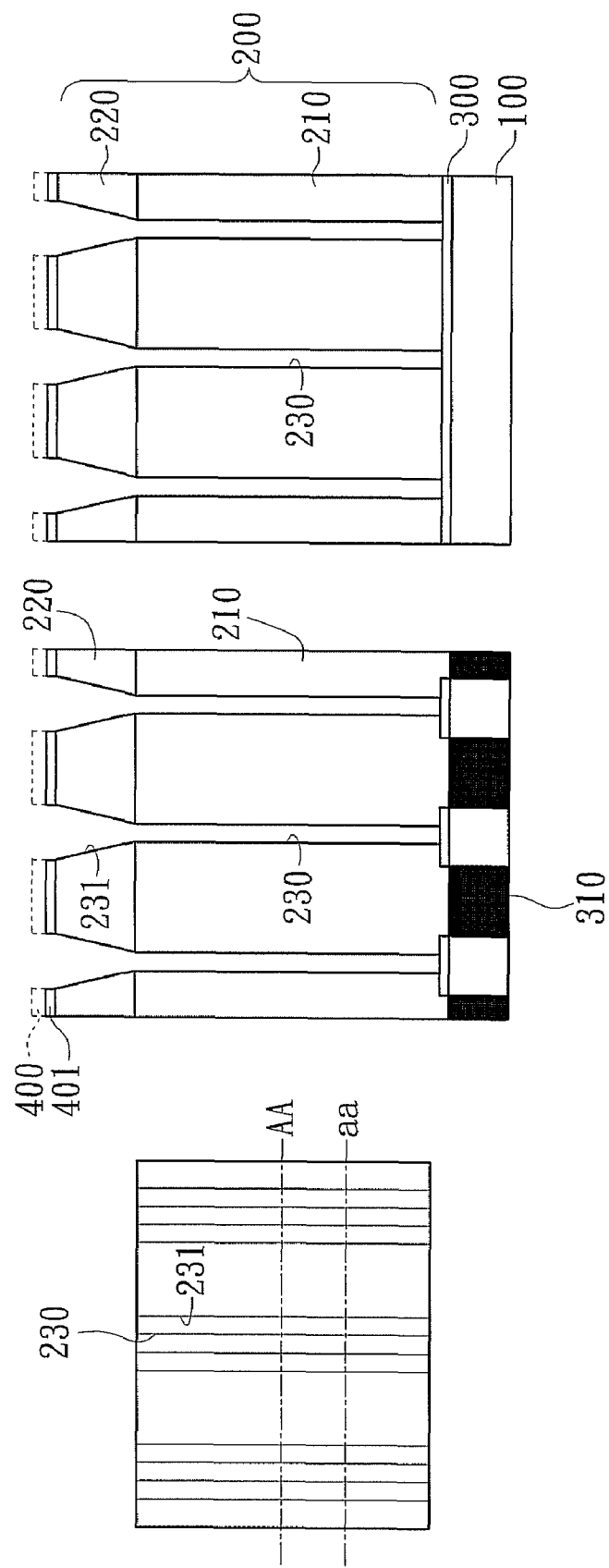

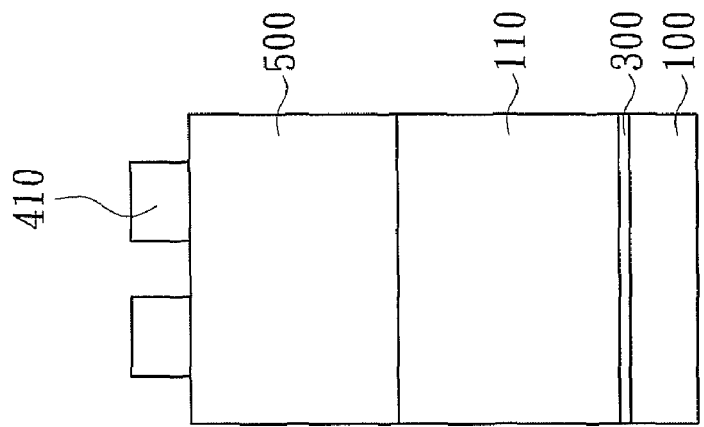
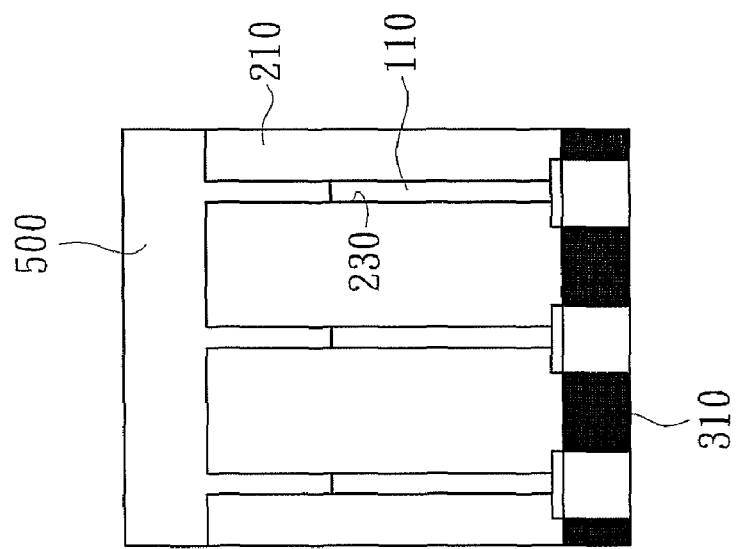
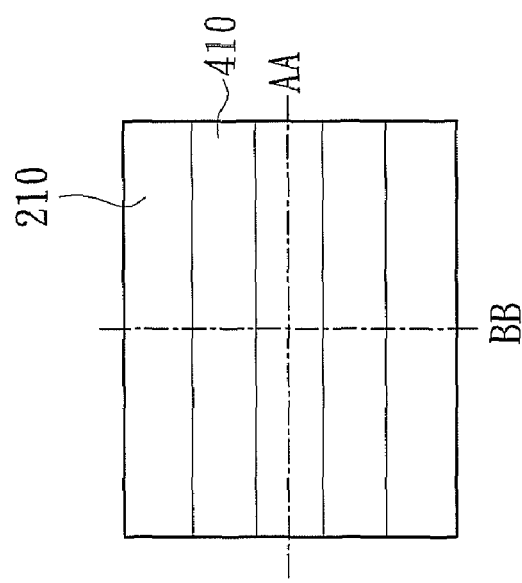
Fig. 3c
Fig. 3b
Fig. 3a

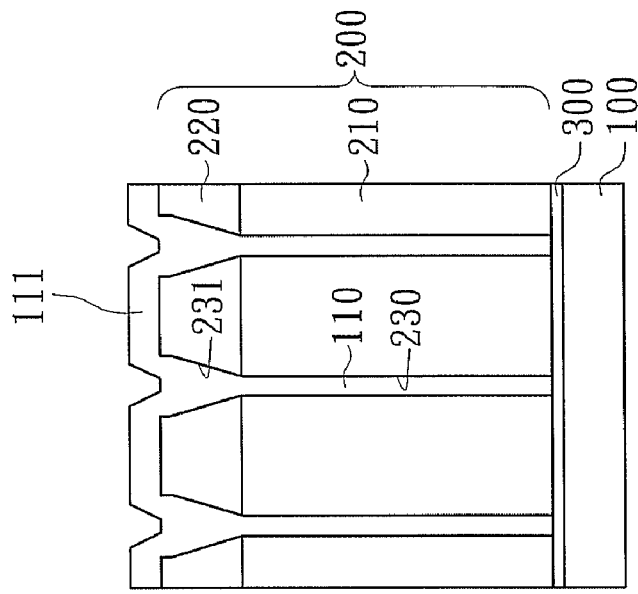
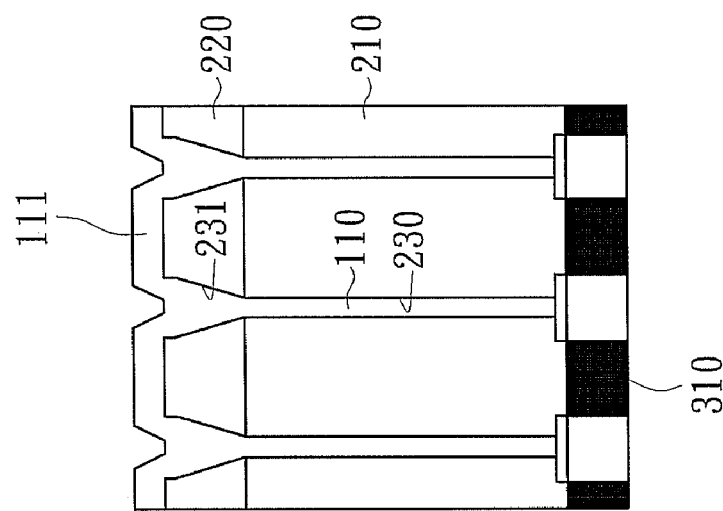
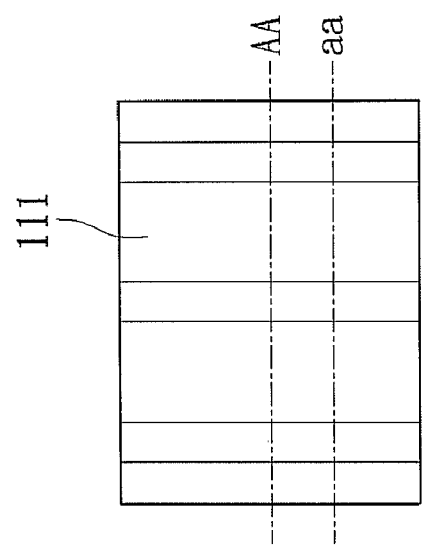
Fig. 8c
Fig. 8b
Fig. 8a

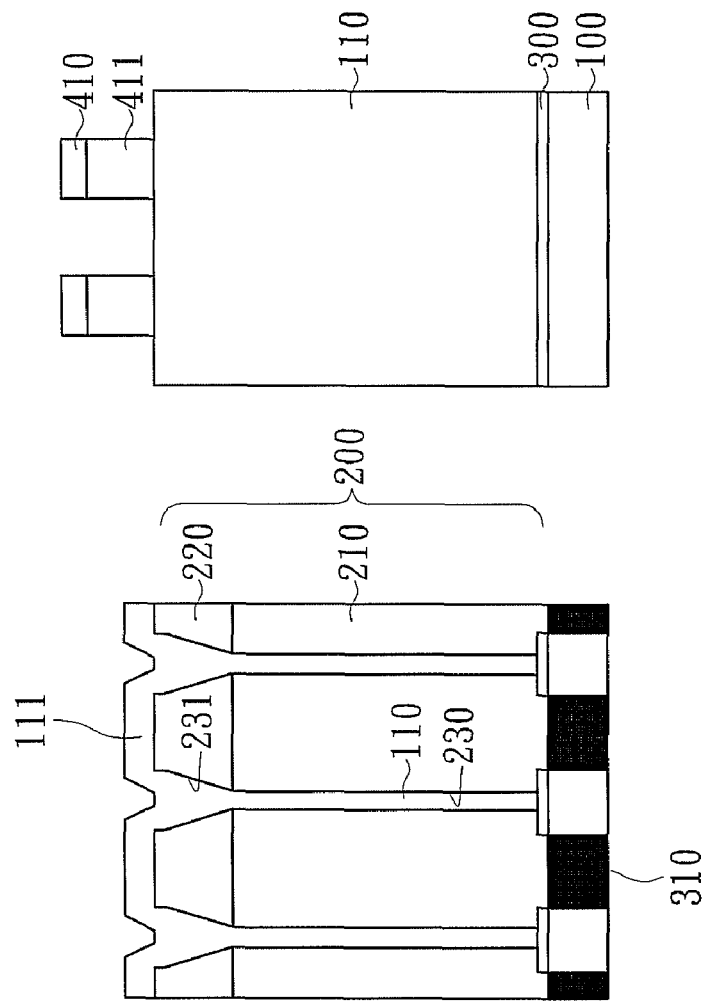
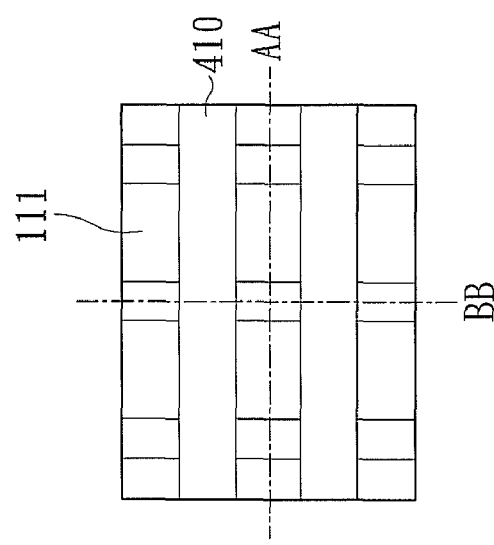
Fig. 9c
Fig. 9b
Fig. 9a

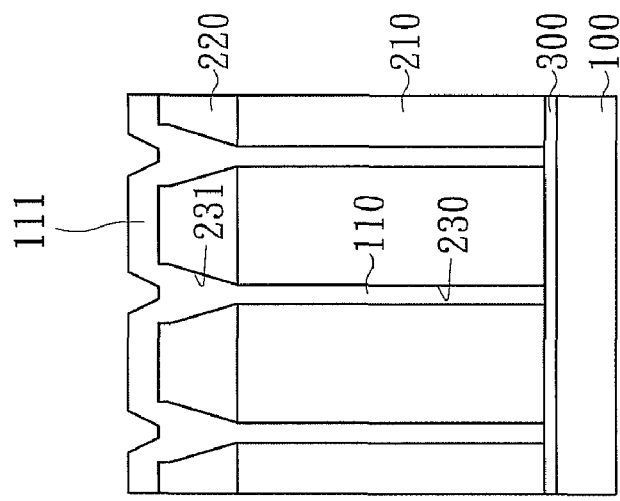
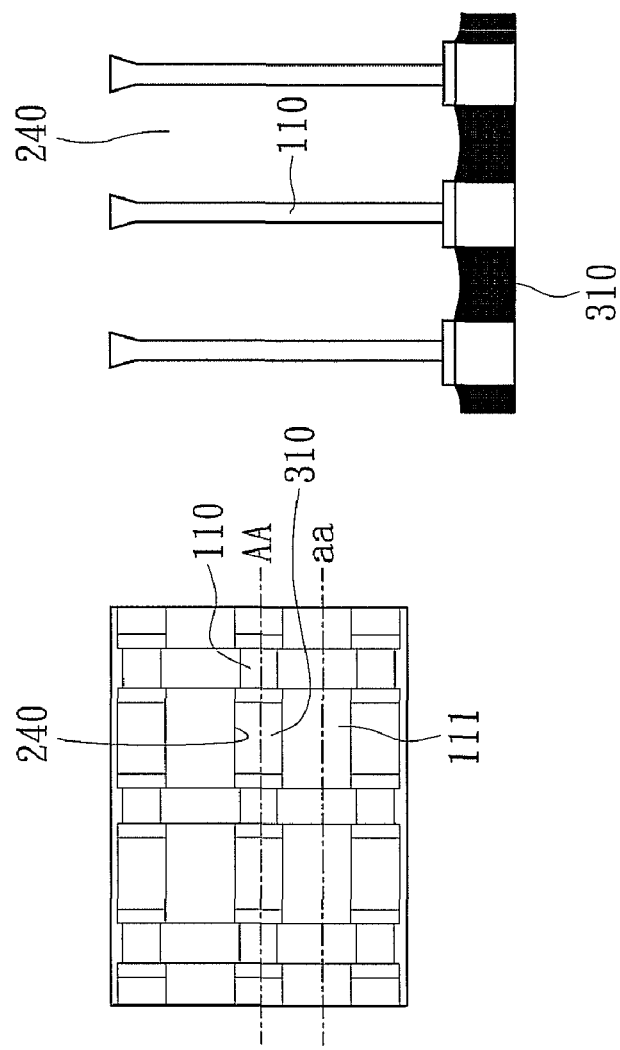
Fig. 12c
Fig. 12b
Fig. 12a

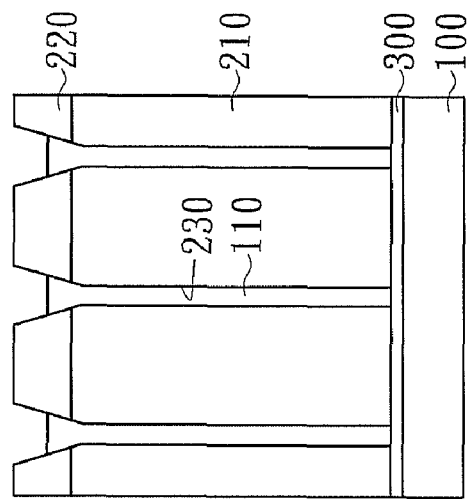
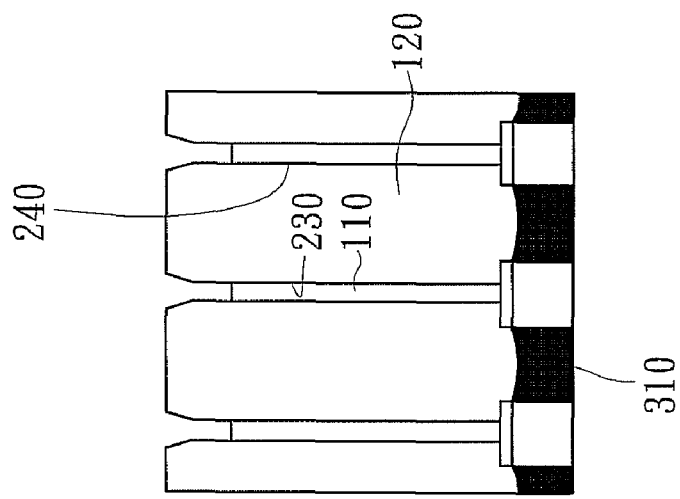
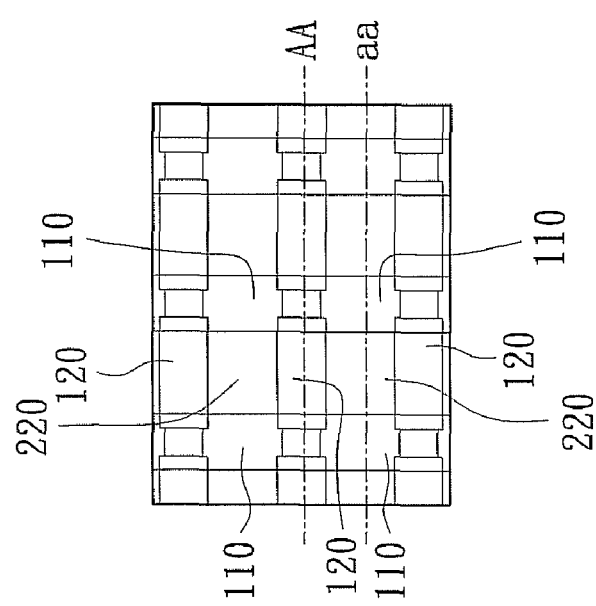
Fig. 14c
Fig. 14b
Fig. 14a

METHOD OF MAKING PLANAR-TYPE BOTTOM ELECTRODE FOR SEMICONDUCTOR DEVICE

RELATED APPLICATIONS

This application claims priority to Taiwan Application Serial Number 96126042, filed Jul. 17, 2007, which is herein incorporated by reference.

BACKGROUND

1. Field of The Invention

The present invention relates to a technique of manufacturing a semiconductor device. More particularly, the present invention relates to a method of making a planar-type bottom electrode for semiconductor devices.

2. Description of Related Art

For applications of semiconductor devices, capacitors have been extensively used for applications related to data storage. Taking dynamic random access memory (DRAM) for example, a DRAM contains a plurality of memory unit cells for data storage. Each memory unit cell comprises a capacitor and a transistor to store data.

Planar-type capacitors are one kind of capacitor structure that is currently used. A planar-type capacitor forms bottom electrodes, dielectrics and plate electrodes in one hole of a dielectric layer. Compared with concave type capacitors, the planar-type capacitors have larger space to receive thicker dielectric (such as high-k dielectrics) and the plate electrode. Thicker dielectrics help reduce current leakage of capacitor.

Using high-k dielectrics may improve capacitance of the memory cell unit, and Equivalent Oxide Thickness (EOTs) of this kind of materials has an inverse proportional relationship to its k value. In other words, when using a dielectric with a higher dielectric constant to replace a dielectric with a lower dielectric constant, the higher dielectric may deposit a thicker film keeping the same capacitance so as to reduce the degree of current leakage.

However, with the feature size of the devices is continuously reduced to a desired size, concave type capacitors have reached their manufacturing limitations, i.e. the hole in the dielectric layer can not provide sufficient space to receive the bottom electrodes, the dielectrics and the plate electrodes.

Therefore, there is a need to provide an improved method of making capacitors to provide enough space to receive the bottom electrodes, the dielectrics and the plate electrodes to mitigate or obviate the aforementioned problems.

SUMMARY

An object of the present invention is to provide a method of making capacitor bottom electrodes for semiconductor devices. The capacitor provides sufficient space to receive and hold the bottom electrodes, dielectrics and the plate electrodes.

An embodiment of a method in accordance with the present invention forms a sacrificial layer structure on a substrate. The next step defines a plurality of first trenches in the sacrificial layer structure, wherein the first trenches are arranged in a first direction. Insulating material fills the first trenches to form an insulating layer in the first trenches.

The next step defines a plurality of second trenches in the sacrificial layer structure, wherein the second trenches are arranged in a second direction, such that the second trenches cross the first trenches. A bottom electrode material fills the second trenches to form a bottom electrode layer in the second trenches, wherein the insulating layers separate respectively the bottom electrode layers.

The sacrificial layer structure is removed, which defines respectively receiving rooms between neighboring bottom electrode layers and neighboring insulating layers.

Another embodiment of a method in accordance with the present invention forms a plurality of insulating layers on a substrate wherein the insulating layers are arranged in a first direction. A plurality of bottom electrode layers forms on the substrate wherein the bottom electrode layers are arranged in a second direction, the second direction intercrosses the first direction. The insulating layers separate respectively the bottom electrode layers to define respectively receiving rooms between neighboring bottom electrode layers and neighboring the insulating layers.

According to the embodiments in accordance with the present invention, applying the present invention has some advantages as follows.

With the receiving rooms defined by the insulating layers and the bottom electrode layers, there is sufficient space for each receiving room to receive and hold the dielectrics and the plate electrodes. The integration of the semiconductor device is improved. The demand of smaller feature size of the device is met.

BRIEF DESCRIPTION OF THE DRAWINGS

These and other features, aspects, and advantages of the present invention will become better understood with regard to the following description, appended claims, and accompanying drawings wherein:

FIG. 1a is a schematic top view of a semiconductor device with a first embodiment of a method in accordance with the present invention when first upper trenches and first trenches are defined in a sacrificial layer structure;

FIG. 1b is a schematic section view of the device along line AA in FIG. 1a;

FIG. 1c is a schematic section view of the device along line aa in FIG. 1a;

FIG. 2b is a schematic section view of the device along line AA in FIG. 2a;

FIG. 2c is a schematic section view of the device along line aa in FIG. 2a;

FIG. 3a is a schematic top view of the device in FIG. 2a when a next step is performed;

FIG. 3b is a schematic section view of the device along line AA in FIG. 3a;

FIG. 3c is a schematic section view of the device along line BB in FIG. 3a;

FIG. 4b is a schematic section view of the device along line BB in FIG. 4a;

FIG. 4c is a schematic section view of the device along line bb in FIG. 4a;

FIG. 5b is a schematic section view of the device along line BB in FIG. 5a;

FIG. 5c is a schematic section view of the device along line bb in FIG. 5a;

FIG. 6b is a schematic section view of the device along line BB in FIG. 6a;

FIG. 6c is a schematic section view of the device along line bb in FIG. 6a;

FIG. 7b is a schematic section view of the device along line BB in FIG. 7a;

FIG. 7c is a schematic section view of the device along line bb in FIG. 7a;

FIG. 8a is a schematic top view of a semiconductor device with a second embodiment of a method in accordance with the present invention when first upper trenches and first trenches are defined in a sacrificial layer structure and an insulating material fills the trenches;

FIG. 8b is a schematic section view of the device along line AA in FIG. 8a;

FIG. 8c is a schematic section view of the device along line aa in FIG. 8a;

FIG. 9a is a schematic top view of the device in FIG. 8a when a next step is performed;

FIG. 9b is a schematic section view of the device along line AA in FIG. 9a;

FIG. 9c is a schematic section view of the device along line BB in FIG. 9a;

FIG. 10b is a schematic section view of the device along line AA in FIG. 10a;

FIG. 10c is a schematic section view of the device along line BB in FIG. 10a;

FIG. 11b is a schematic section view of the device along line AA in FIG. 11a;

FIG. 11c is a schematic section view of the device along line aa in FIG. 11a;

FIG. 12a is a schematic top view of the device in FIG. 11a when a next step is performed;

FIG. 12b is a schematic section view of the device along line AA in FIG. 12a;

FIG. 12c is a schematic section view of the device along line aa in FIG. 12a;

FIG. 13b is a schematic section view of the device along line AA in FIG. 13a;

FIG. 13c is a schematic section view of the device along line aa in FIG. 13a;

FIG. 14a is a schematic top view of the device in FIG. 13a when a next step is performed;

FIG. 14b is a schematic section view of the device along line AA in FIG. 14a;

FIG. 14c is a schematic section view of the device along line aa in FIG. 14a;

FIG. 15b is a schematic section view of the device along line AA in FIG. 15a; and FIG. 15c is a schematic section view of the device along line aa in FIG. 15a.

DESCRIPTION OF THE PREFERRED EMBODIMENTS

Figure 2C:
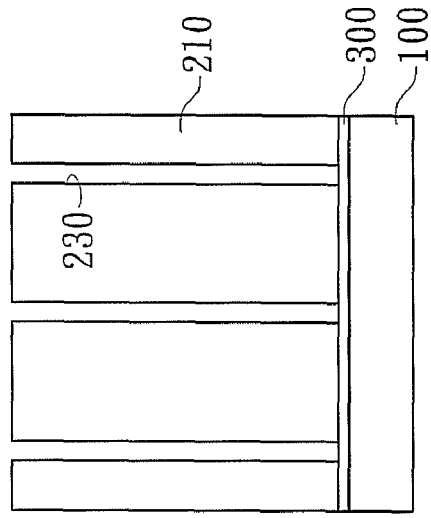

Reference will now be made in detail to the present preferred embodiments of the invention, examples of which are illustrated in the accompanying drawings. Wherever possible, the same reference numbers are used in the drawings and the description to refer to the same or like parts.

An embodiment of a method of making capacitor bottom electrodes for semiconductors in accordance with the present invention may be applied to semiconductor devices, such as DRAM. The following description provides an illustrative example of making capacitor bottom electrodes of DRAM. A DRAM comprises a plurality of storage nodes. Each storage node needs capacitors. The capacitor comprises bottom electrodes, dielectrics and plate electrodes.

Refer to FIG. 1a, FIG. 1b and FIG. 1c. A first embodiment in accordance with the present invention comprises forming a sacrificial layer structure 200 on a substrate 100. An etching stop layer 300 is formed between the sacrificial layer structure 200 and the substrate 100. The substrate 100 contains storage node contacts 310. The sacrificial layer structure 200 comprises a lower layer 210 and an upper layer 220. The lower layer 210 may be a silicon oxide layer, such as $SiO_2$. The upper layer 220 may be polysilicon.

The next step is to define multiple first trenches 230 in the sacrificial layer structure 200. The first trenches 230 are arranged in a first direction. The first trenches 230 are defined by a mask layer 400 (such as a photo resistant mask) and a hard mask layer 401 that pattern the upper layer 220 to form multiple first upper trenches 231. A dry etching process may form the first upper trenches 231 in the upper layer 220. In the embodiment, the first upper trenches are tapered trenches, i.e. the width of the trench is gradually narrowed along the direction towards the lower layer 210. After the first upper trenches 231 are formed, a dry etching process through the first upper trenches 231 may form the first trenches 230 in the lower layer 210. Thus, tapered first upper trenches 231 can generate smaller line widths for the first trenches 230 than the line widths provided by the reticles. The mask layer 400 may be stripped after the first trenches 230 have been defined.

Figure 2B:
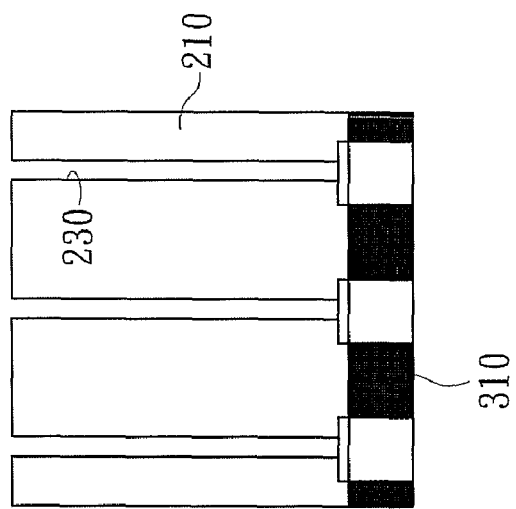
Figure 2A:
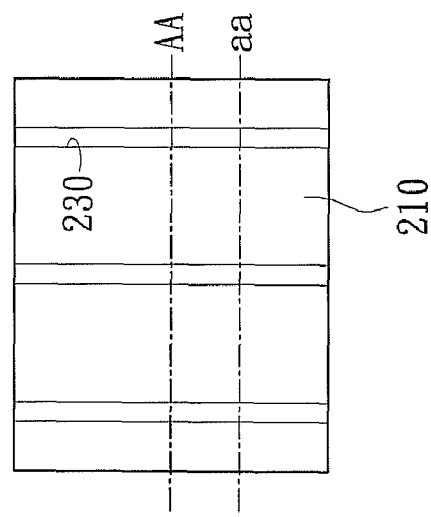
FIG. 2a is a schematic top view of the device in FIG. 1a when a next step is performed.

Refer to FIG. 2a, FIG. 2b and FIG. 2c. The next step removes the upper layer 220 of the sacrificial layer structure 200. A wet etching process may remove the upper layer 220.

Refer to FIG. 3a, FIG. 3b and FIG. 3c. An insulating material fills the first trenches 230. The insulating material is partially etched (etching back) to reduce its height in the first trenches 230 and to form an insulating layer 110 in each of the first trenches 230. Therefore, the height of the insulating layer 110 is smaller than the depth of the first trench 230 because of the etching back process. The insulating material may be silicon nitride. A protective layer 500 is deposited on the lower layer 210 after the etching back process. The protective layer 500 partially fills the first groves 230 and may be polysilicon (Poly Si).

Figure 4C:
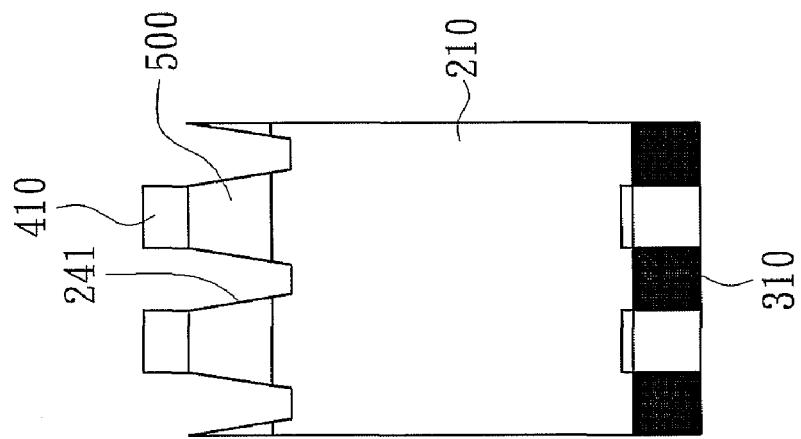
Figure 4B:
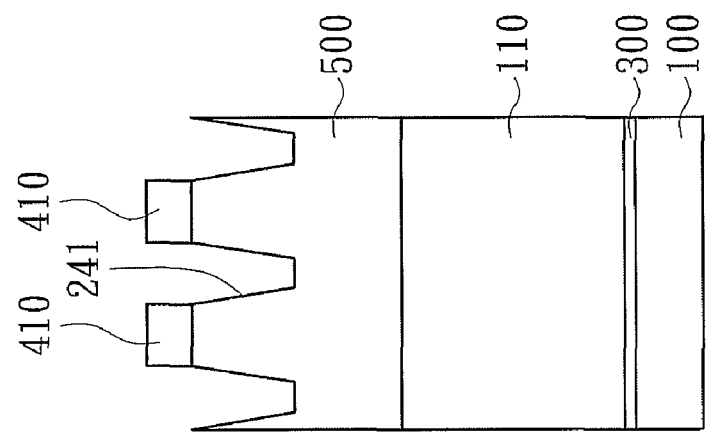
Figure 4A:
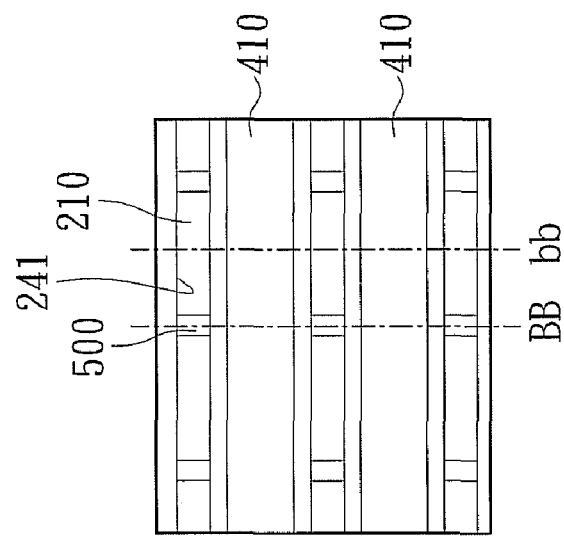
FIG. 4a is a schematic top view of the device in FIG. 3a when a next step is performed.
Figure 5C:
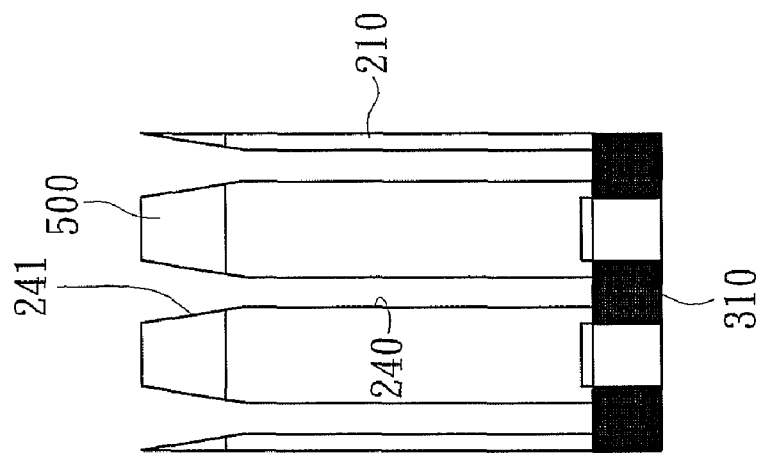

Further refer to FIG. 4a, FIG. 4b and FIG. 4c. Multiple second upper trenches 241 are defined in the protective layer 500 to form multiple second trenches 240 in the lower layer 210 of the sacrificial layer structure 200 (as shown in FIG. 5c). The second trenches 240 are arranged in a second direction such that the second trenches intersect the first trenches. In the embodiment, the first direction is substantially perpendicular to the second direction.

The process of defining the second trenches 240 is similar to that of defining the first trenches 230. Using a mask layer 410 (such as a photo resistant layer) patterns the protective layer 500 so as to form the second upper trenches 241 in the protective layer 500. The mask layer 410 may be stripped after the second upper trenches 241 are defined in the protective layer 500 with a dry etching process. In the embodiment, the second upper trenches 241 are tapered trenches, i.e. the width of the trench is gradually narrowed along the direction towards the lower layer 210.

Figure 5B:
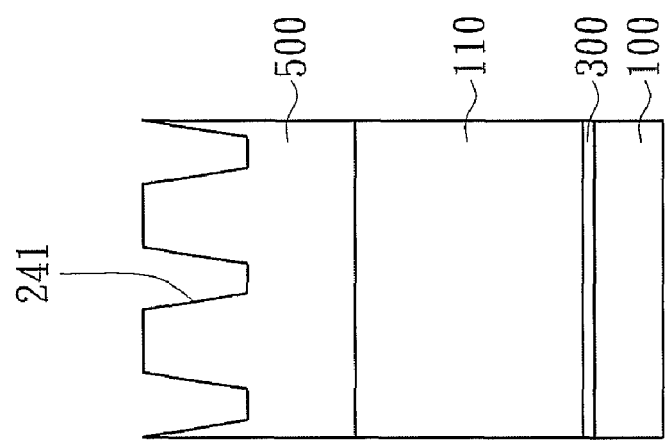
Figure 5A:
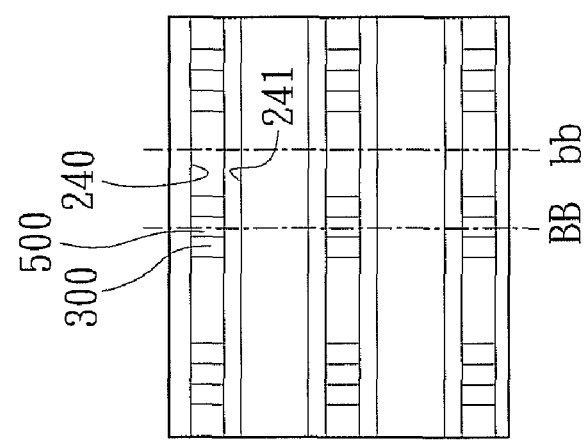
FIG. 5a is a schematic top view of the device in FIG. 4a when a next step is performed.

Refer to FIG. 5a, FIG. 5b and FIG. 5c. Etching the lower layer 210 through the second upper trenches 241 defines the second trenches 240 in the lower layer 210 with the dry etching process. Likewise, tapered second upper trenches 241 generate smaller line widths for the second trenches 240 than the line width provided by the reticles.

Figure 6C:
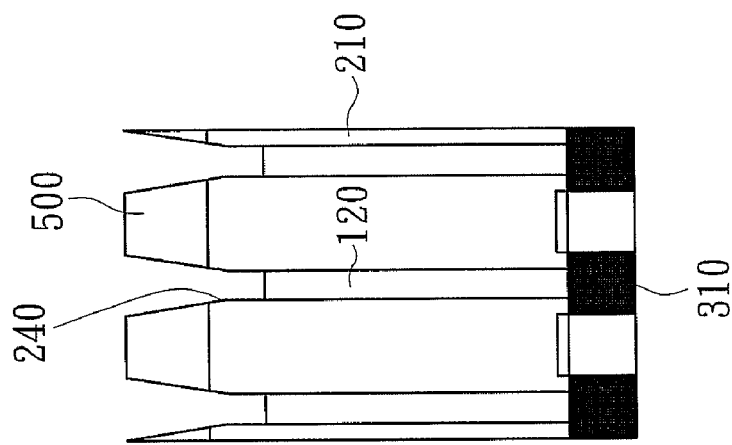
Figure 6B:
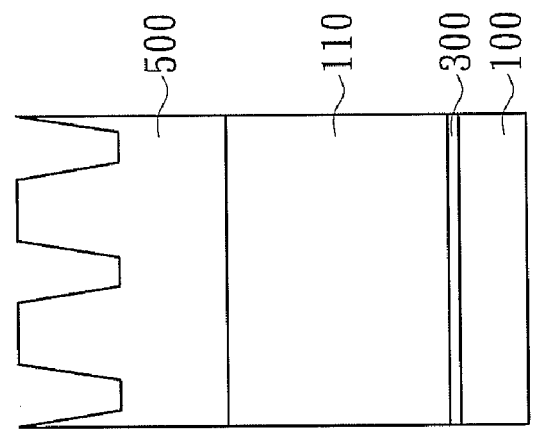
Figure 6A:
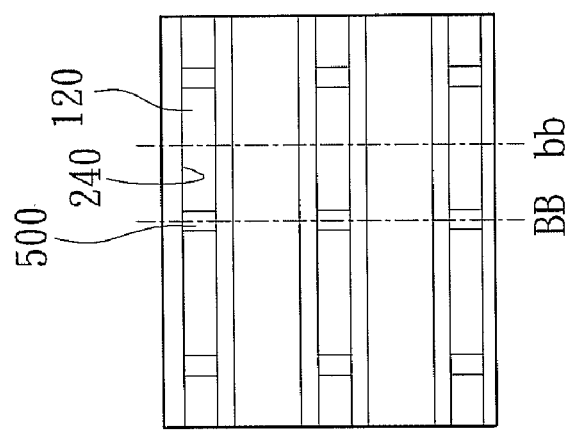
FIG. 6a is a schematic top view of the device in FIG. 5a when a next step is performed.

Refer to FIG. 6a, FIG. 6b and FIG. 6c. An electrode material fills the second trenches 240. The electrode material is partially etched (etching back) to reduce its height in the second trenches 240 and form a bottom electrode layer 120 in each of the second trenches 240. The insulating layers 110 respectively separate the bottom electrode layer 120. Therefore, the height of the bottom electrode layer 120 is smaller than the depth of the second trench 240 because of the etching back process.

Figure 7C:
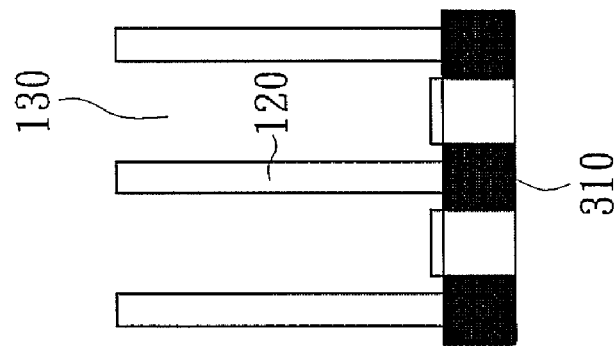
Figure 7B:
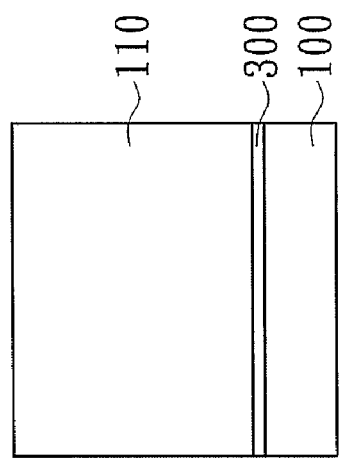
Figure 7A:
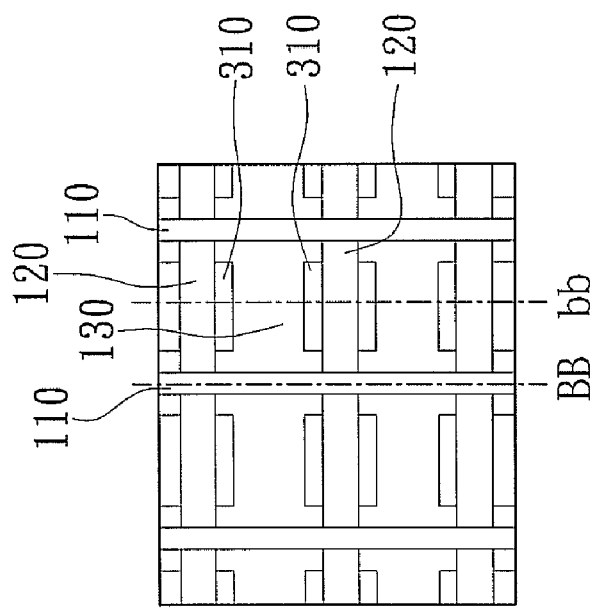
FIG. 7a is a schematic top view of the device in FIG. 6a when a next step is performed.

Refer to FIG. 7a, FIG. 7b and FIG. 7c. The lower layer 210 of the sacrificial layer structure 200 and the protective layer 500 may be stripped by wet etching process. The removal of the lower layer 210 forms a receiving room 130 between a pair of neighboring insulating layers 110 and a pair of neighboring bottom electrode layers 120. The receiving room 130 may receive and hold the dielectrics and the plate electrodes.

Refer to FIG. 8a, FIG. 8b and FIG. 8c. A second embodiment of a method of making a capacitor bottom electrode provides alternative steps when the first trenches 230 and the first upper trenches 231 have been defined as shown in FIG. 1a to FIG. 1c. An insulating material layer 111 may be deposited on the sacrificial layer structure 200 and fills simultaneously the first trenches 230 and the first upper trenches 231 so as to form an insulating layer 110 in each of the first trenches 230. The insulating material may be nitride.

Refer to FIG. 9a, FIG. 9b and FIG. 9c. The next step defines multiple second trenches 240 in the lower layer 210 of the sacrificial layer structure 200 (as shown in FIG. 11b). The second trenches 240 are arranged in a second direction such that the second trenches intersect the first trenches. In the embodiment, the first direction is substantially perpendicular to the second direction.

Figure 10C:
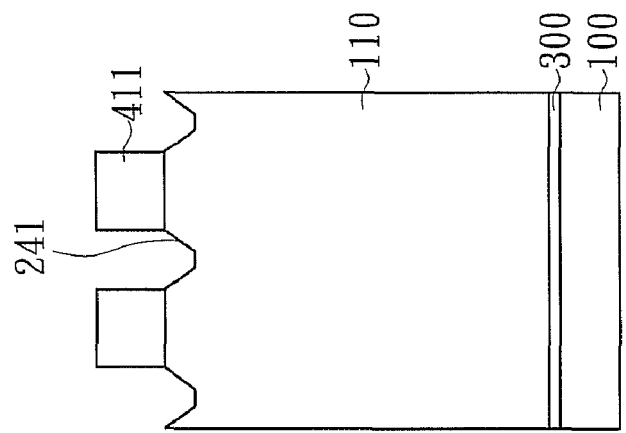
Figure 10B:
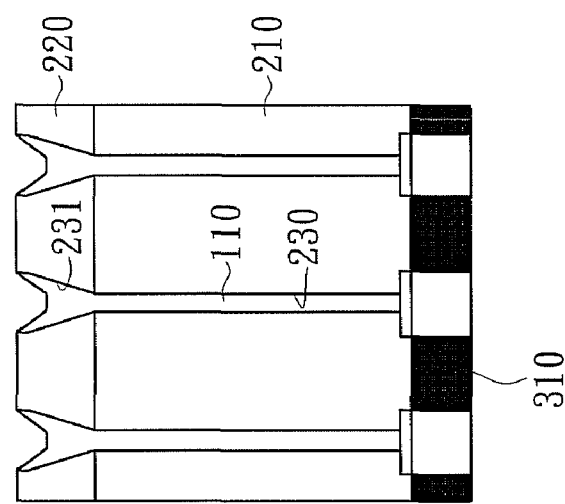
Figure 10A:
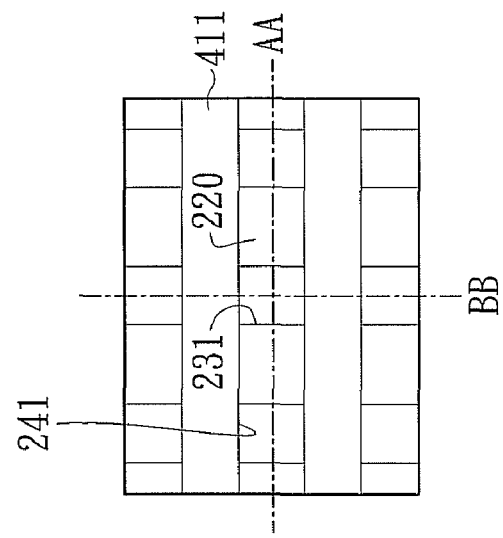
FIG. 10a is a schematic top view of the device in FIG. 9a when a next step is performed.

Further refer to FIG. 10a, FIG. 10b and FIG. 10c. The process of defining the second trenches 240 is similar to that of defining the first trenches 230. Using a mask layer 410 (such as a photo resist layer) and a bottom anti reflective coating (BARC) layer 411 patterns the insulating material layer 111 so as to form the second upper trenches 241 in the insulating material layer 111. The second upper trenches 241 are tapered trenches, i.e. the width of the trench is gradually narrowed along the direction towards the lower layer 210, and expose partially the upper layer 220 (Poly-Si layer) under the insulating material layer 111. The mask layer 410 may be stripped after the second upper trenches 241 are defined in the insulating material layer 111 with dry etching process.

Figure 11C:
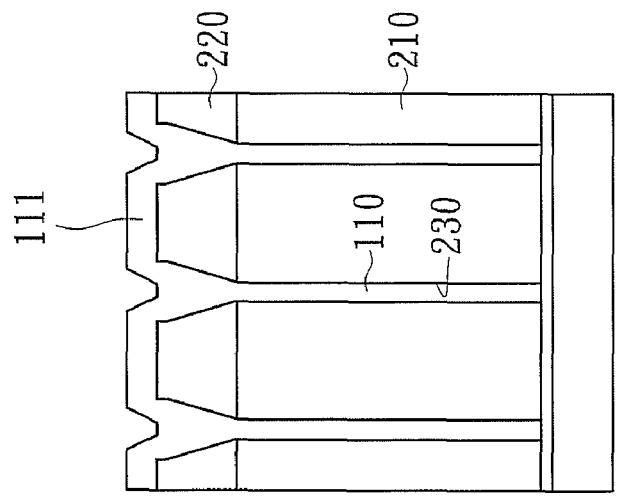
Figure 11B:
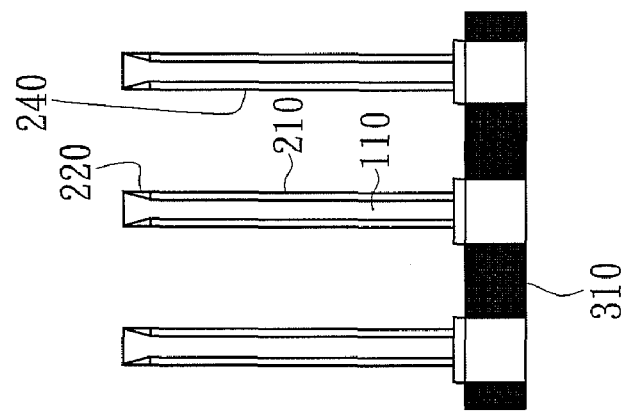
Figure 11A:
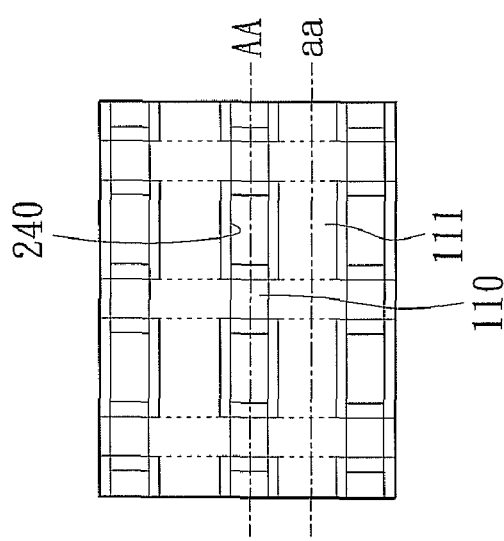
FIG. 11a is a schematic top view of the device in FIG. 10a when a next step is performed.

Refer to FIG. 11a, FIG. 11b and FIG. 11c. The second trenches 240 may be defined by etching the upper layer 220 and the lower layer 210 with a dry etching process through the second upper trenches 241.

Refer to FIG. 12a, FIG. 12b and FIG. 12c. The next step removes the rest silicon oxide and poly silicon inside the second trenches 240 (i.e. the silicon oxide and poly silicon of the upper layer 220 and the lower layer 210 reside on the sidewalls of the insulating layer 110) by a wet etching process.

Figure 13C:
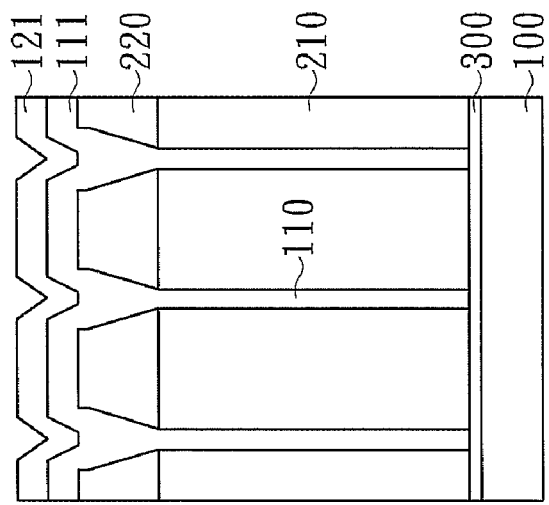
Figure 13B:
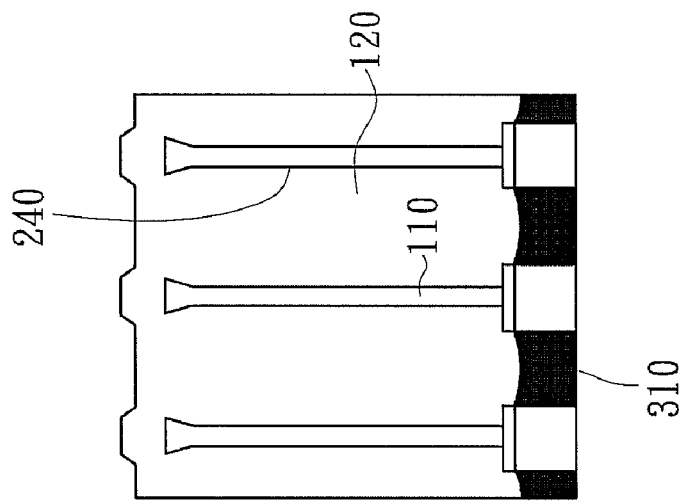
Figure 13A:
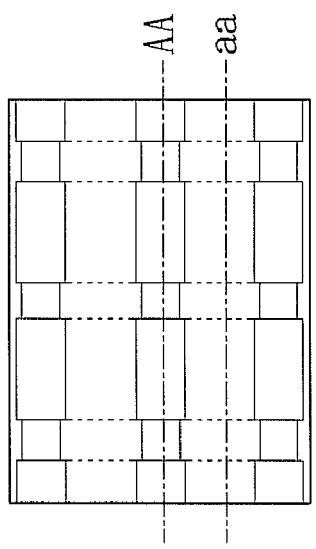
FIG. 13a is a schematic top view of the device in FIG. 12a when a next step is performed.

Refer to FIG. 13a, FIG. 13b and FIG. 13c. A bottom electrode material 121 fills the second trenches 240 so as to form a bottom electrode layer 120 in the second trenches 240.

Refer to FIG. 14a, FIG. 14b and FIG. 14c. The bottom electrode material 121 is etched (etching back). The insulating layer 110 is partially etched to reduce its height in the first trenches 230. The insulating layer 100 separates respectively the bottom electrode layer 120.

Figure 15C:
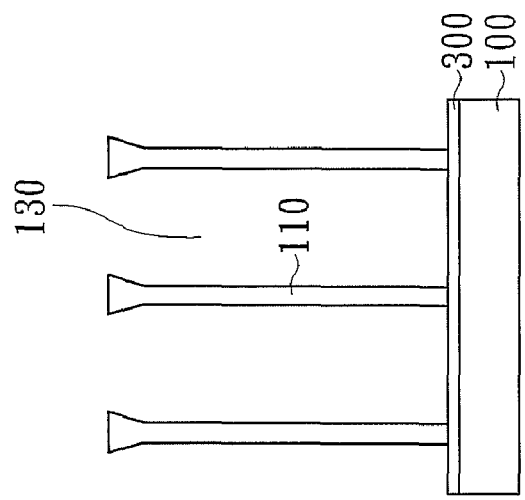
Figure 15B:
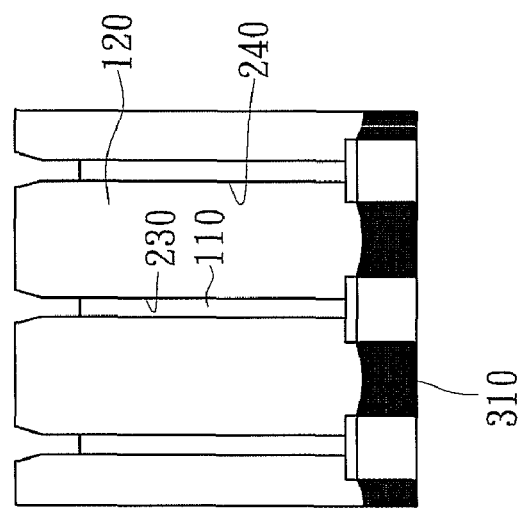
Figure 15A:
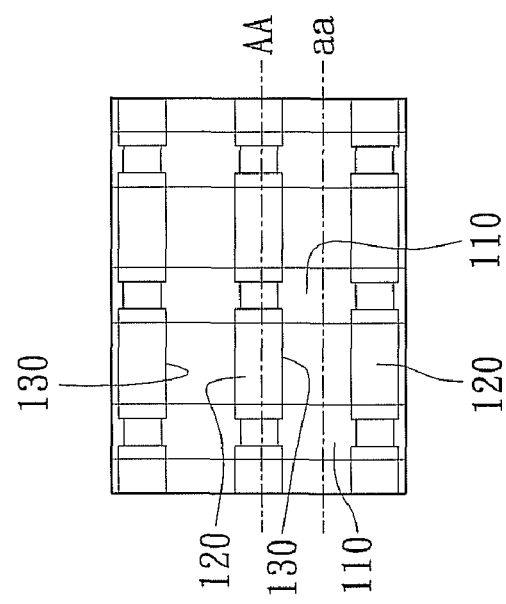
FIG. 15a is a schematic top view of the device in FIG. 14a when a next step is performed.

Refer to FIG. 15a, FIG. 15b and FIG. 15c. The rest silicon oxide and polysilicon (i.e. the upper layer 220 and the lower layer 210 of the sacrificial layer structure 200 between the insulating layer 110 and the bottom electrode layer 120) is removed. The removal of the upper layer 220 and the lower layer 210 may use wet etching process, and forms a receiving room 130 between a pair of the insulating layers 110 and a pair of the bottom electrode layers 120. The receiving room 130 may receive and hold the dielectrics and the plate electrodes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of making a capacitor bottom electrode of a semiconductor device, the method comprising:
    forming a sacrificial layer structure on a substrate, wherein the sacrificial layer structure includes a lower layer and an upper layer, and the lower layer is a silicon oxide layer, and the upper layer is a polysilicon layer;
    defining a plurality of first trenches in the sacrificial layer structure, wherein the first trenches are arranged in a first direction;
    filling the first trenches with an insulating material to form an insulating layer in each of the first trenches;
    defining a plurality of second trenches in the sacrificial layer structure, wherein the second trenches are arranged in a second direction, and the second direction intercrosses the first direction;
    filling the second trenches with a bottom electrode material to form a bottom electrode layer in each of the second trenches, wherein the insulating layers separate respectively the bottom electrode layers; and
    removing the sacrificial layer structure to define a plurality of receiving rooms between neighboring bottom electrode layers and neighboring insulating layers.

2. The method as claimed in claim 1, wherein the substrate includes a plurality of storage nodes.

3. The method as claimed in claim 2, wherein the step of defining a plurality of first trenches in the sacrificial layer structure comprises:
    defining a plurality of first upper trenches in the upper layer;
    defining the first trenches in the lower layer through the first upper trenches; and
    removing the upper layer of the sacrificial layer structure.

4. The method as claimed in claim 3, wherein
    each of the first upper trenches is a tapered trench;
    the step of filling the first trenches with an insulating material comprises:
        etching back the insulating material in the first trenches to form the insulating layers; and
        depositing a protective layer on the lower layer and filling the first trenches with the protective layer, wherein the insulating material is silicon nitride, and the protective layer is polysilicon.

5. The method as claimed in claim 4, wherein the step of defining a plurality of second trenches in the sacrificial layer structure comprises:

defining a plurality of second upper trenches in the protective layer, wherein each of the second upper trenches is a tapered trench; and
defining the second trenches in the lower layer through the second upper trenches.

6. The method as claimed in claim 5, wherein
the step of filling the second trenches with a bottom electrode material includes etching back the bottom electrode material in the second trenches to form the bottom electrode layers; and
the step of removing the sacrificial layer structure to define a plurality of receiving rooms includes removing the lower layer of the sacrificial layer structure and the protective layer.

7. The method as claimed in claim 2, wherein the step of defining a plurality of first trenches in the sacrificial layer structure comprises:
defining a plurality of first upper trenches in the upper layer, wherein each of the first upper trenches is a tapered trench; and
defining the first trenches in the lower layer through the first upper trenches.

8. The method as claimed in claim 7, wherein the step of filling the first trenches with an insulating material includes depositing the insulating material on the sacrificial layer structure and filling simultaneously the first trenches and the first upper trenches with the insulating material to form the insulating layers, wherein the insulating material is nitride.

9. The method as claimed in claim 8, wherein the step of defining a plurality of second trenches in the sacrificial layer structure comprises:
defining a plurality of second upper trenches by patterning the insulating material, wherein the second upper trenches expose the upper layer under the insulating material; and
etching the upper layer and the lower layer through the second upper trenches to form the second trenches.

10. The method as claimed in claim 9, wherein the step of etching the upper layer and the lower layer comprises:
using a dry etching process to the upper layer and the lower layer; and
removing the rest of the upper layer and the lower layer inside the second trenches with a wet etching process.

11. The method as claimed in claim 10, wherein the step of filling the second trenches with a bottom electrode material includes etching back the bottom electrode material in the second trenches and removing partially the insulating layers.

12. The method as claimed in claim 11, wherein the step of removing the sacrificial layer structure to define a plurality of receiving rooms includes removing the upper layer and the lower layer between the insulating layers and the bottom electrode layers.

13. A method of making a capacitor bottom electrode of a semiconductor device, the method comprising:
forming a sacrificial layer structure on the substrate, wherein the sacrificial layer structure includes a lower layer and an upper layer, the lower layer is a silicon oxide layer, and the upper layer is a polysilicon layer;
defining a plurality of first trenches in the sacrificial layer structure, wherein the first trenches are arranged along the first direction; and
filling an insulating material into the first trenches to form a plurality of insulating layers in the first trenches, wherein the insulating layers are arranged in a first direction; and
forming a plurality of bottom electrode layers on the substrate, wherein the bottom electrode layers are arranged in a second direction, the second direction intercrosses the first direction, and the insulating layers separate respectively the bottom electrode layers to define a receiving room between each pair of the bottom electrode layers with an adjacent pair of the insulating layers.

14. The method as claimed in claim 13, wherein the step of forming a plurality of bottom electrode layers on the substrate comprises:
defining a plurality of second trenches in the sacrificial layer structure between the insulating layers, wherein the second trenches are arranged in a second direction, and the second trenches intersect the first trenches; and
filling an bottom electrode material into the second trenches to form the bottom electrode layers in the second trenches, wherein the insulating layers separate respectively the bottom electrode layers; and
removing the sacrificial layer structure.

15. The method as claimed in claim 14, wherein
the substrate includes a plurality of storage nodes;
the step of defining a plurality of first trenches in the sacrificial layer structure comprises:
defining a plurality of first upper trenches in the upper layer, wherein each of the first upper trenches is a tapered trench;
defining the first trenches in the lower layer through the first upper trenches; and
removing the upper layer of the sacrificial layer structure; and
the step of filling an insulating material into the first trenches comprises:
etching back the insulating material in the first trenches to form the insulating layers; and
depositing a protective layer on the lower layer and filling the first trenches with the protective layer wherein the insulating material is silicon nitride, and the protective layer is polysilicon.

16. The method as claimed in claim 15, wherein
the step of defining a plurality of second trenches in the sacrificial layer structure comprises:
defining a plurality of second upper trenches in the protective layer, wherein each of the second upper trenches is a tapered trench; and
defining the second trenches in the lower layer through the second upper trenches;
the step of filling a bottom electrode material into the second trenches comprises:
etching back the bottom electrode material in the second trenches to form the bottom electrode layers in the second trenches; and
the step of removing the sacrificial layer structure includes removing the lower layer of the sacrificial layer structure and the protective layer.

17. The method as claimed in claim 14, wherein
the substrate includes a plurality of storage nodes;
the step of defining a plurality of first trenches in the sacrificial layer structure includes defining a plurality of first upper trenches in the upper layer, wherein each of the first upper trenches is a tapered trench; and defining the first trenches in the lower layer through the first upper trenches; and
the step of filling an insulating material into the first trenches includes depositing the insulating material on the sacrificial layer structure and filling simultaneously the first trenches and the first upper trenches with the insulating material to form the insulating layers, wherein the insulating material is nitride.

18. The method as claimed in claim 17, wherein the step of defining a plurality of second trenches in the sacrificial layer structure comprises:
- defining a plurality of second upper trenches by patterning the insulating material, wherein the second upper trenches expose the upper layer under the insulating material; and
- etching the upper layer and the lower layer through the second upper trenches with a dry etching process and removing the rest of the upper layer and the lower layer inside the second trenches with a wet etching process to form the second trenches.

19. The method as claimed in claim 17, wherein
the step of filling a bottom electrode material into the second trenches comprises:
- etching back the bottom electrode material in the second trenches and removing partially the insulating layers; and
- the step of removing the sacrificial layer structure includes removing the upper layer and the lower layer between the insulating layers and the bottom electrode layers.

* * * * *